(12) United States Patent
Radhakrishnan et al.

(10) Patent No.: US 9,141,469 B2
(45) Date of Patent: Sep. 22, 2015

(54) EFFICIENT AND SCALABLE CYCLIC REDUNDANCY CHECK CIRCUIT USING GALOIS-FIELD ARITHMETIC

(71) Applicant: Intel Corporation, Santa Clara, CA (US)

(72) Inventors: Sivakumar Radhakrishnan, Portland, OR (US); Mark A. Schmisseur, Phoenix, AZ (US); Sin S. Tan, Portland, OR (US); Kenneth C. Haren, Portland, OR (US); Thomas C. Brown, Portland, OR (US); Pankaj Kumar, Chandler, AZ (US); Vinodh Gopal, Westborough, MA (US); Wajdi K. Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 14/083,059

(22) Filed: Nov. 18, 2013

(65) Prior Publication Data

US 2014/0082451 A1    Mar. 20, 2014

Related U.S. Application Data

(62) Division of application No. 13/175,500, filed on Jul. 1, 2011, now Pat. No. 8,607,129.

(51) Int. Cl.
| | | |
|---|---|---|
| *G06F 11/10* | (2006.01) | |
| *H03M 13/00* | (2006.01) | |
| *H03M 1/10* | (2006.01) | |
| *H03M 7/42* | (2006.01) | |

(Continued)

(52) U.S. Cl.
CPC ............ *G06F 11/10* (2013.01); *G06F 11/1076* (2013.01); *H03M 1/1052* (2013.01); *H03M 7/42* (2013.01); *H03M 13/09* (2013.01); *H03M 13/091* (2013.01); *H03M 13/158* (2013.01); *H03M 13/6575* (2013.01)

(58) Field of Classification Search
CPC ............... G06F 11/1076; G06F 11/10; H03M 13/6575; H03M 13/091; H03M 1/1052; H03M 7/42; H03M 13/09; H03M 13/158
USPC .......... 714/781, 799, 800, 807, 808, 758, 759
See application file for complete search history.

(56) References Cited

U.S. PATENT DOCUMENTS

| | | | | |
|---|---|---|---|---|
| 5,539,756 | A * | 7/1996 | Glaise et al. ................. | 714/776 |
| 5,948,117 | A * | 9/1999 | Weng et al. .................. | 714/784 |
| 6,058,215 | A * | 5/2000 | Schwartz et al. ............. | 382/244 |

(Continued)

FOREIGN PATENT DOCUMENTS

| | | |
|---|---|---|
| EP | 0840462 B1 | 12/2004 |
| JP | 2004-135172 A | 4/2004 |

OTHER PUBLICATIONS

Ji et al., "Fast Parallel CRC Algorithm and Implementation on a Configurable Processor," pp. 1813-1817, IEEE Micro, 2002.

(Continued)

*Primary Examiner* — John J Tabone, Jr.
(74) *Attorney, Agent, or Firm* — Schwabe, Williamson & Wyatt, P.C.

(57) ABSTRACT

Embodiments of the present disclosure describe methods, apparatus, and system configurations for cyclic redundancy check circuits using Galois-field arithmetic.

21 Claims, 6 Drawing Sheets

(51) Int. Cl.
*H03M 13/09* (2006.01)
*H03M 13/15* (2006.01)

(56) References Cited

U.S. PATENT DOCUMENTS

| | | | | |
|---|---|---|---|---|
| 6,128,760 | A * | 10/2000 | Poeppleman et al. | 714/757 |
| 6,223,320 | B1 * | 4/2001 | Dubey et al. | 714/757 |
| 6,766,493 | B1 * | 7/2004 | Hoffman et al. | 714/785 |
| 6,844,756 | B1 * | 1/2005 | Moore | 326/39 |
| 6,904,558 | B2 * | 6/2005 | Cavanna et al. | 714/781 |
| 6,912,683 | B2 * | 6/2005 | Rifaat et al. | 714/774 |
| 7,096,408 | B1 * | 8/2006 | Ireland et al. | 714/784 |
| 7,760,880 | B2 * | 7/2010 | Dave et al. | 380/240 |
| 7,886,214 | B2 | 2/2011 | Gopal et al. | |
| 8,418,021 | B2 * | 4/2013 | Lin et al. | 714/755 |
| 8,607,129 | B2 * | 12/2013 | Radhakrishnan et al. | 714/781 |
| 2002/0057103 | A1 * | 5/2002 | Ngai et al. | 326/39 |
| 2003/0068037 | A1 * | 4/2003 | Bertoni et al. | 380/30 |
| 2003/0167440 | A1 | 9/2003 | Cavanna et al. | |
| 2004/0078410 | A1 | 4/2004 | Porten et al. | |
| 2006/0107181 | A1 * | 5/2006 | Dave et al. | 714/758 |
| 2007/0208796 | A1 * | 9/2007 | Lablans | 708/492 |
| 2009/0019342 | A1 | 1/2009 | Gueron et al. | |
| 2009/0158132 | A1 | 6/2009 | Gopal et al. | |
| 2009/0164546 | A1 * | 6/2009 | Gopal et al. | 708/620 |
| 2009/0313523 | A1 * | 12/2009 | Huang | 714/752 |
| 2010/0005368 | A1 * | 1/2010 | Lee | 714/768 |
| 2010/0153829 | A1 | 6/2010 | Gopal et al. | |
| 2010/0153859 | A1 | 6/2010 | Dawson et al. | |
| 2011/0145683 | A1 | 6/2011 | Gopal et al. | |
| 2013/0007573 | A1 * | 1/2013 | Radhakrishnan et al. | 714/807 |
| 2014/0082451 | A1 * | 3/2014 | Radhakrishnan et al. | 714/758 |

OTHER PUBLICATIONS

International Search Report and Written Opinion for PCT/US2012/044735 mailed Mar. 20, 2013, 7 pages.

* cited by examiner

EFFICIENT AND SCALABLE CYCLIC REDUNDANCY CHECK CIRCUIT USING GALOIS-FIELD ARITHMETIC

CROSS REFERENCE TO RELATED APPLICATION

This application is a divisional application of U.S. patent application Ser. No. 13/175,500 entitled "EFFICIENT AND SCALABLE CYCLIC REDUNDANCY CHECK CIRCUIT USING GALOIS-FIELD ARITHMETIC," filed Jul. 1, 2011, the entire contents of which is hereby incorporated by reference in its entirety.

FIELD

Embodiments of the present disclosure generally relate to the field of error detection, and more particularly, to a cyclic redundancy check circuit using Galois-field arithmetic.

BACKGROUND

Data integrity is an important feature for storage and communication systems. It is desirable for detection and, if possible, correction, to occur as early as possible to reduce impact to system integrity and performance.

Cyclic redundancy check (CRC) codes are efficient and effective data integrity tools for error checking. Several methods for calculating CRC and hardware have been proposed in the past. These methods include bit-serial methods that use linear feedback shift registers (LFSRs) and parallel methods that utilize lookup tables for CRC computation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
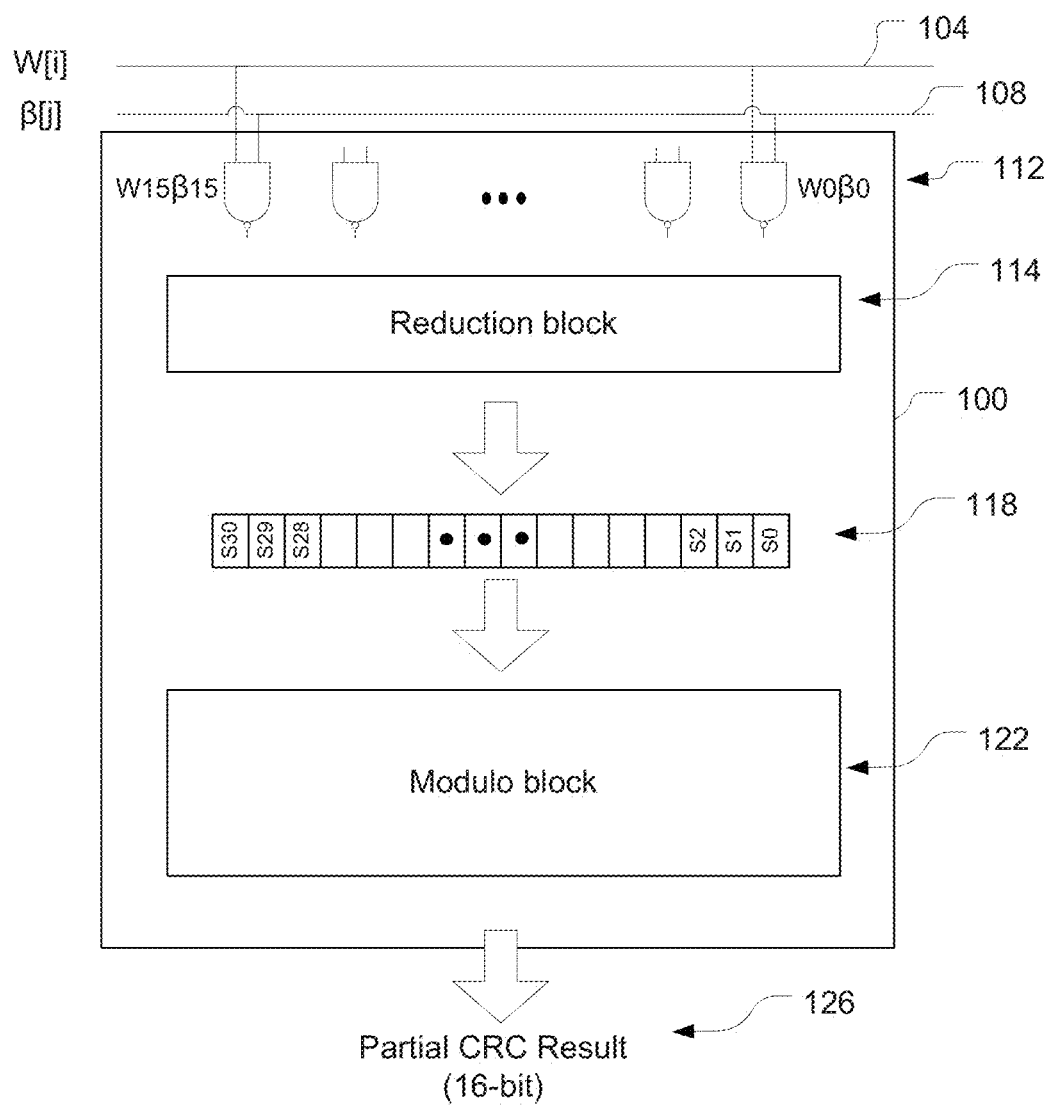
FIG. 1 schematically illustrates a multiplier circuit in accordance with some embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Embodiments of this disclosure describe a cyclic redundancy check (CRC) circuit capable of using a variety of seeds and having a modular and expandable block that is amenable for any arbitrary data length. The CRC circuit may provide a high throughput that helps to meet performance benchmarks for hardware-based storage input/output (I/O) controllers, such as those used in redundant array of independent disk (RAID) and/or small computer system interface (SCSI) systems.

Embodiments of the present disclosure may be discussed with respect to SCSI interfaces that are consistent with the architecture command sets, protocols and physical layers promulgated by the T10 technical committee of the International Committee on Information Technology Standards (INCITS). In particular, many embodiments are described with reference to a SCSI T10 16-bit CRC polynomial $x16+x15+x11+x9+x8+x7+x5+x4+x2+x+1$ (also referred to as "0x18BB7") based on Galois field (GF2) arithmetic. However, it will be understood that the disclosed concepts may be applicable to providing data integrity protection with other generator polynomials within other contexts, such as communication systems or other storage systems.

Bit-sliced CRC using GF2 arithmetic may be described as follows. Let W be input data of arbitrary length, M be the CRC width, n be the number of bit slices, and $G(x)$ be the irreducible generator polynomial in $GF2^M$ (e.g., 0x18BB7), where M=16. W may then be represented, in polynomial format, by:

$$W = (w_{nM-1}x^{nM-1} + \ldots + w_{(n-1)M}x^{(n-1)M})x^{(n-1)M} + \ldots + (w_{2M-1}x^{2M-1} + \ldots + w_M x^M)$$
$$x^M + (w_{M-1}x^{M-1} + \ldots + w_0 x^0) \quad \text{Equation 1}$$

In Equation 1, the first term, $(w_{nM-1}x^{nM-1} + \ldots + w_{(n-1)M}x^{(n-1)M})x^{(n-1)M}$, may represent the first bit slice, e.g., the most significant 16 bits of the input data, and the last term, $(w_{M-1}x^{M-1} + \ldots + w_0 x^0)$, may represent the last bit slice, e.g., the least significant 16 bits of the input data. A "bit slice," or "slice," as used in the described embodiments is 16 consecutive bits of the input data, however, in various embodiments bit slices may have any other number of consecutive bits.

Equation 1 may be reduced to the sum of products, represented by the modulus term, W mod $G(x)$, of Equation 2.

$$W \bmod G(x) = \lfloor (w_{nM-1}x^{M-1} + \ldots + w_{(n-1)M}x^0) \quad \text{Equation 2}$$
$$x^{(n-1)M} + \ldots +$$
$$(w_{2M-1}x^{M-1} + \ldots + w_M x^0)x^M +$$
$$(w_{M-1}x^{M-1} + \ldots + w_M x^0)\rfloor x^M$$
$$= [(w_{nM-1}x^{M-1} + \ldots + w_{(n-1)M}x^0)$$

-continued $$x^{nM} + \ldots + (w_{2M-1}x^{M-1} + \ldots + w_M x^0)$$
$$x^{2M} + (w_{M-1}x^{M-1} + \ldots + w_0 x^0)x^M ]$$
$$\mod G(x)$$
$$= [W_{n-1} * \beta_{n-1} + \ldots + W_1 * \beta_1 +$$
$$W_0 * \beta_0] \mod G(x)$$

Thus, as can be seen by Equation 2, the basic element required for the T10 16-bit CRC is the GF2 multiplier given by $W_i^* \beta_i$ for a given bit length, where $\beta_i$, i=0, ..., n−1 may be given by the recurrence relation defined by Equation 3, as follows.

$$\beta_0 = \beta_0 = G(x)$$
$$\beta_1 = \beta_0 * \beta_0 = \beta_0^2$$
$$\beta_2 = \beta_0 * \beta_1 = \beta_0^3$$
$$\beta_i = \beta_0 * \beta_{i-1} = \beta_0^{i+1}$$
$$\beta_{n-1} = \beta_0 * \beta_{n-2} = \beta_0^n \quad \text{Equation 3}$$

The constants $\beta_i$ may be calculated, by hand or software program, and input into a lookup table (LUT) for subsequent computations as will be described below in accordance with various embodiments. In various embodiments, the constants $\beta_i$ may either be precalculated or calculated on-the-fly, depending on various objectives and considerations such as, but not limited to, run-time processing resources, storage resources, etc.

FIG. 1 schematically illustrates a multiplier circuit 100 in accordance with some embodiments. The multiplier circuit 100 may be coupled with input line 104, to receive a slice of the input data as a multiplicand, W[i], and input line 108, to receive predetermined beta constants as a multiplier, β[j]. In some embodiments, the multiplier circuit 100 may be a 16×16 GF2 multiplier circuit with the multiplicand and the multiplier being 16-bit values. The multiplier circuit 100 may, in such instances, also be referred to as a 16-bit multiplier circuit. Other embodiments may include other sized multiplier circuits.

The multiplicand and multiplier may be provided to logic array 112 of the multiplier circuit 100. The logic array 112, as shown, includes two-hundred fifty-six AND logic modules ($W_0\beta_0 \ldots W_{15}\beta_{15}$). Generically, in an n-bit multiplier circuit, the AND logic modules may range from $W_0\beta_0 \ldots W_{n-1}\beta_{n-1}$. It will be understood that AND logic modules are modules that are configured to provide an AND operation such as AND gates or their equivalents. The logic array 112 may generate a dot product array, which in an n-bit multiplier circuit would be an n×n cross product with the individual terms being Wiβj, based on the multiplicand and multiplier.

The multiplier circuit 100 may have a reduction block 114 coupled with the logic array 112. The reduction block reduces the dot product array to partial sums 118 using a Galois-field reduction. By using Galois-field reduction, the dot product array may be reduced without having to carry over higher-order values from one column to the next. Thus, the reduction process of the dot product array may be performed as a straightforward XOR of the various columns of the dot product array. The partial sums 118 may be a 31-bit value shown as S[30:0] in FIG. 1. Generically, in an n-bit GF2 multiplier circuit, the partial sums 118 may be S[2n-2:0].

The multiplier circuit 100 includes a GF2 modulo block 122 that receives the partial sums 118 and performs a modulo operation based on the generator polynomial, e.g., 0x1BB7, to generate a GF2 product result, or partial CRC result 126. In an embodiment, the partial CRC result 126 may be a 16-bit value, represented by S'[15:0], that corresponds to Wi * Bi mod G(x) (compare to Equation 2). The partial CRC result 126 may represent a CRC result for the slice of the data received by the multiplier circuit 100.

The GF2 modulo block 122 may generate the individual bits of the partial CRC result 126 by XOR'ing respective subsets of bits of the partial sums 118 as determined by Boolean equations that represent influence of higher-order bits of the partial sum array, e.g., S[30:16], on the individual bits of the partial CRC result 126. For example, if S16 is "1," then the LSB of the generator polynomial, i.e., bit 0, will affect sum S'0. Hence, S16's influence on S'0 needs to be accounted. The Boolean equations for the partial CRC result S'[15:0] are as follows, where "^" represents an XOR operation:

S'[0]=S[0] ^ S[16] ^ S[17] ^ S[18] ^ S[19] ^ S[20] ^ S[22] ^ S[23] ^ S[26] ^ S[28] ^ S[29];
S'[1]=S[1] ^ S[16] ^ S[21] ^ S[22] ^ S[24] ^ S[26] ^ S[27] ^ S[28] ^ S[30];
S'[2]=S[2] ^ S[16] ^ S[18] ^ S[19] ^ S[20] ^ S[25] ^ S[26] ^ S[27];
S'[3]=S[3] ^ S[17] ^ S[19] ^ S[20] ^ S[21] ^ S[26] ^ S[27] ^ S[28];
S'[4]=S[4] ^ S[16] ^ S[17] ^ S[19] ^ S[21] ^ S[23] ^ S[26] ^ S[27];
S'[5]=S[5] ^ S[16] ^ S[19] ^ S[23] ^ S[24] ^ S[26] ^ S[27] ^ S[29];
S'[6]=S[6] ^ S[17] ^ S[20] ^ S[24] ^ S[25] ^ S[27] ^ S[28] ^ S[30];
S'[7]=S[7] ^ S[16] ^ S[17] ^ S[19] ^ S[20] ^ S[21] ^ S[22] ^ S[23] ^ S[25];
S'[8]=S[8] ^ S[16] ^ S[19] ^ S[21] ^ S[24] ^ S[28] ^ S[29];
S'[9]=S[9] ^ S[16] ^ S[18] ^ S[19] ^ S[23] ^ S[25] ^ S[26] ^ S[28] ^ S[30];
S'[10]=S[10] ^ S[17] ^ S[19] ^ S[20] ^ S[24] ^ S[26] ^ S[27] ^ S[29];
S'[11]=S[11] ^ S[16] ^ S[17] ^ S[19] ^ S[21] ^ S[22] ^ S[23] ^ S[25] ^ S[26] ^ S[27] A S[29] ^ S[30];
S'[12]=S[12] ^ S[17] ^ S[18] ^ S[20] ^ S[22] ^ S[23] ^ S[24] ^ S[26] ^ S[27] ^ S[28] A S[30];
S'[13]=S[13] ^ S[18] ^ S[19] ^ S[21] ^ S[23] ^ S[24] ^ S[25] ^ S[27] ^ S[28] ^ S[29];
S'[14]=S[14] ^ S[19] ^ S[20] ^ S[22] ^ S[24] ^ S[25] ^ S[26] ^ S[28] ^ S[29] ^ S[30]; and
S'[15]=S[15] ^ S[16] ^ S[17] ^ S[18] ^ S[19] ^ S[21] ^ S[22] ^ S[25] ^ S[27] ^ S[28] A S[30].

Thus, the 16-bit partial CRC result 126, i.e., S'[15:0], is computed from the 31-bit partial sums 118, i.e., S[30:0], by performing an exclusive OR on each of the 16 lower-order bits, i.e., S[15:0], of the partial sums 118 with a selected non-sequential number of the higher-order bits, i.e., S[30:16] of the partial sums 118. Utilizing the above Boolean equations may streamline the generation of the partial CRC result 126 resulting in faster, more efficient CRC generation.

Figure 2:
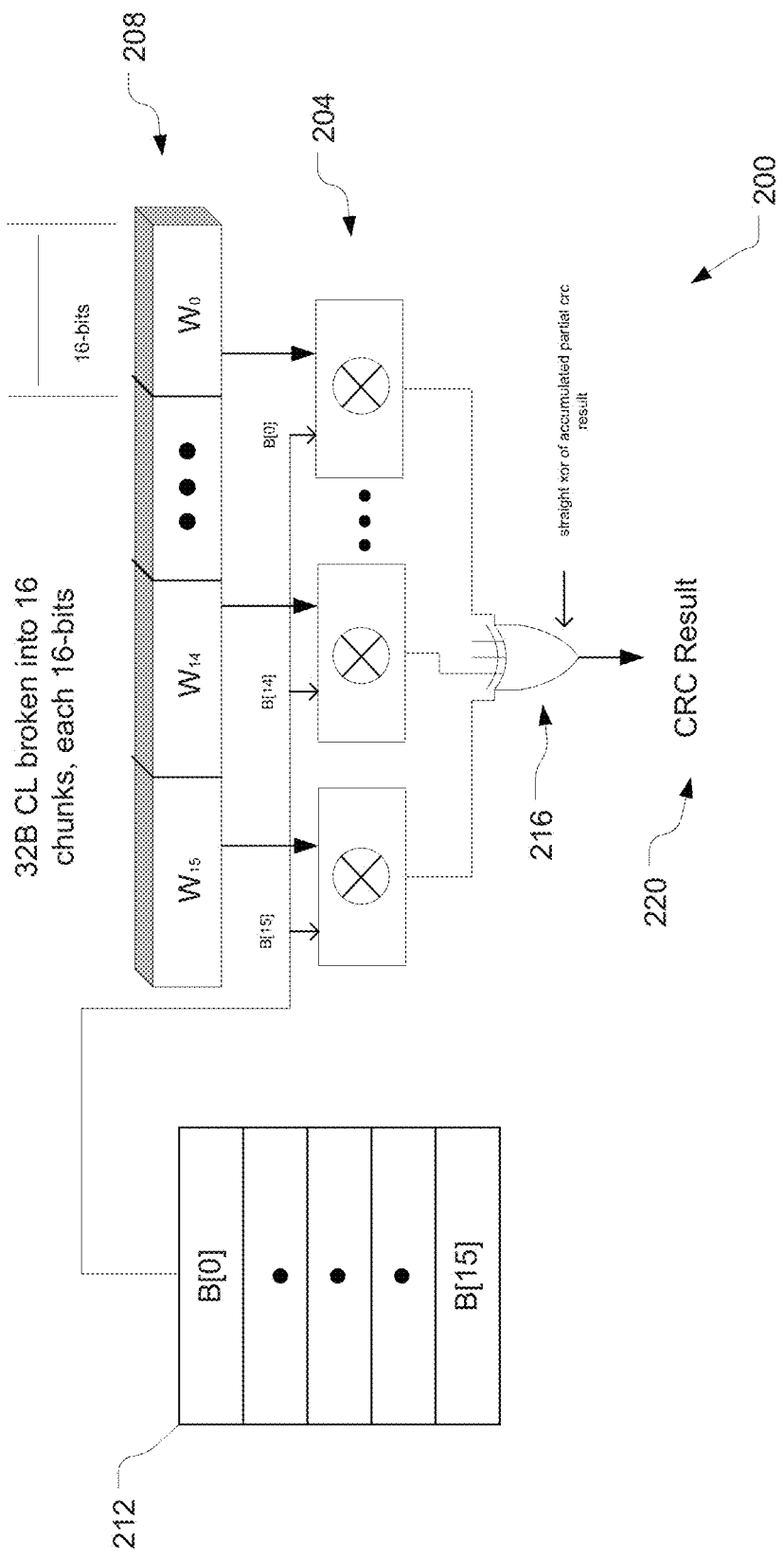
FIG. 2 schematically illustrates a cyclic redundancy check block in accordance with some embodiments.

FIG. 2 schematically illustrates a CRC block 200 in accordance with some embodiments. The CRC block 200 may include a plurality of 16×16 GF2 multiplier circuits 204, which may be similar to multiplier circuit 100. The CRC block 200 may be configured to divide 32-bytes of input data 208, which may represent half of a cache line in some architectures, into sixteen 16-bit slices, e.g., $W_0$-$W_{15}$.

Each of the multiplier circuits 204 may receive a respective slice from the input data 208 and beta constants from a lookup table 212. Each of the multiplier circuits 204 may output a respective partial CRC result, which may be combined by a combiner 216. The combiner 216 may be an XOR module, e.g., an XOR gate or its equivalent, that combines the partial CRC results from the multiplier circuit 204 into a CRC result 220 that corresponds to the input data 208.

Depending on the availability of library elements for a given technology such as multi-input XOR gates, the CRC result 220 may be obtained in this little as 2 or 3 clock cycles.

Figure 3:
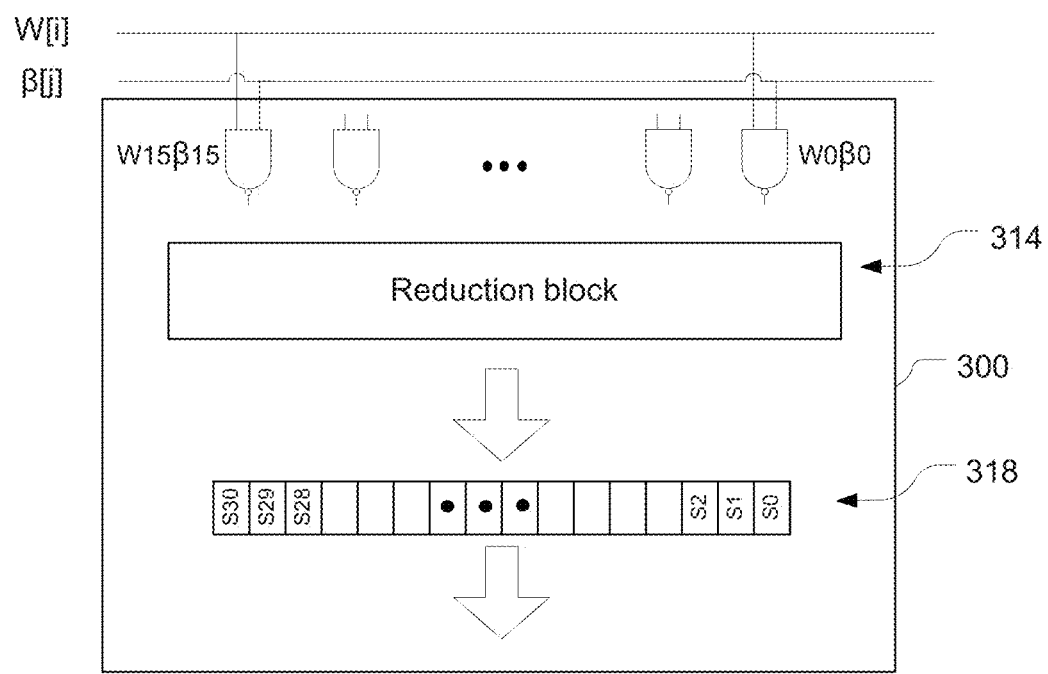
FIG. 3 schematically illustrates another multiplier circuit in accordance with some embodiments.
Figure 4:
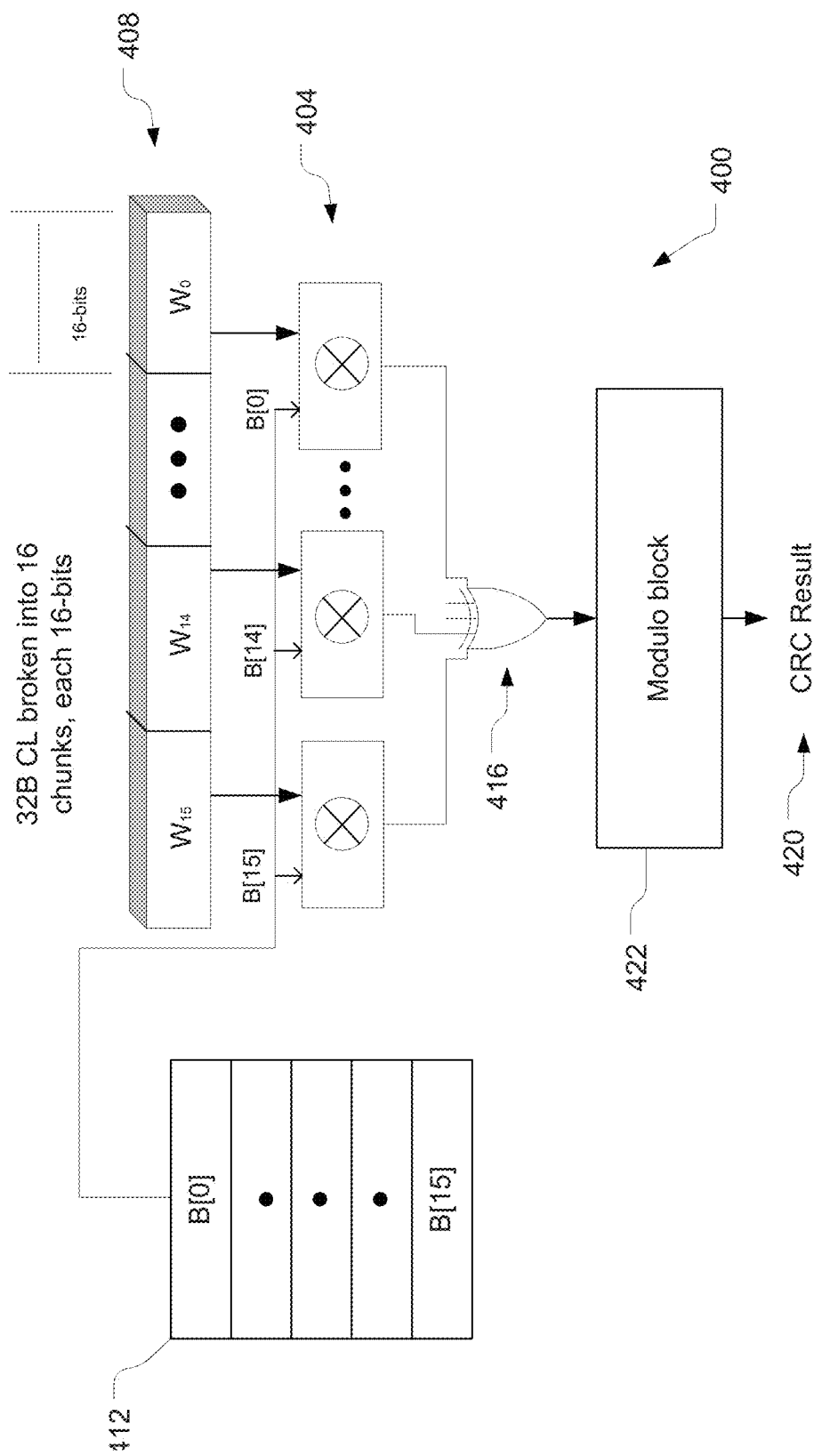
FIG. 4 schematically illustrates another cyclic redundancy check block in accordance with some embodiments.

FIGS. 3 and 4 schematically illustrate a multiplier circuit 300 and CRC block 400, respectively, in accordance with some embodiments. The multiplier circuit 300 may be similar to multiplier circuit 100 except that multiplier circuit 300 does not include a modulo block. Rather, the multiplier circuit 300 outputs a partial sum array 318.

The CRC block 400 may be similar to CRC block 200 except that CRC block 400 may include multiplier circuits 404 that are similar to multiplier circuit 300 and may further include modulo block 422. The CRC block 400 may include a combiner 416 coupled with each of the multiplier circuits 404 to receive respective 31-bit partial sum arrays 318. The combiner 416 may XOR the partial sum arrays 318 to provide a combined sum array. The combined sum array may be provided to the modulo block 422, which provides a modulo operation similar to that described above with respect to modulo block 122. The output of the modulo block 422 may be a CRC result 420 corresponding to the input data 408.

The footprint of the CRC block 400 may be reduced by moving the modulo block 422 after the combiner 416 in CRC, as opposed to having one in each of the multiplier circuits 404. Throughput rates of CRC blocks 200 and 400 may be comparable to one another.

In the above embodiment the CRC result was computed for a 32-byte portion of data using 16 blocks of 16×16 multiplier circuits. Embodiments of the present disclosure may be extended to calculate CRC results for larger data portions, e.g., 512 bytes, 4096 bytes, or larger, by using Horner's rule to manage the overhead hardware complexity. For example, computing a CRC result for a 512-byte data set would involve 512/32=16 CRC blocks as described above. However, with Horner's rule, we can compute the CRC result using only one 32-byte CRC block and make use of the time shift as data streams are received to calculate the CRC result using an extra multiplier circuit and some additional logic circuitry. This reduces the hardware complexity without sacrificing performance.

Figure 5:
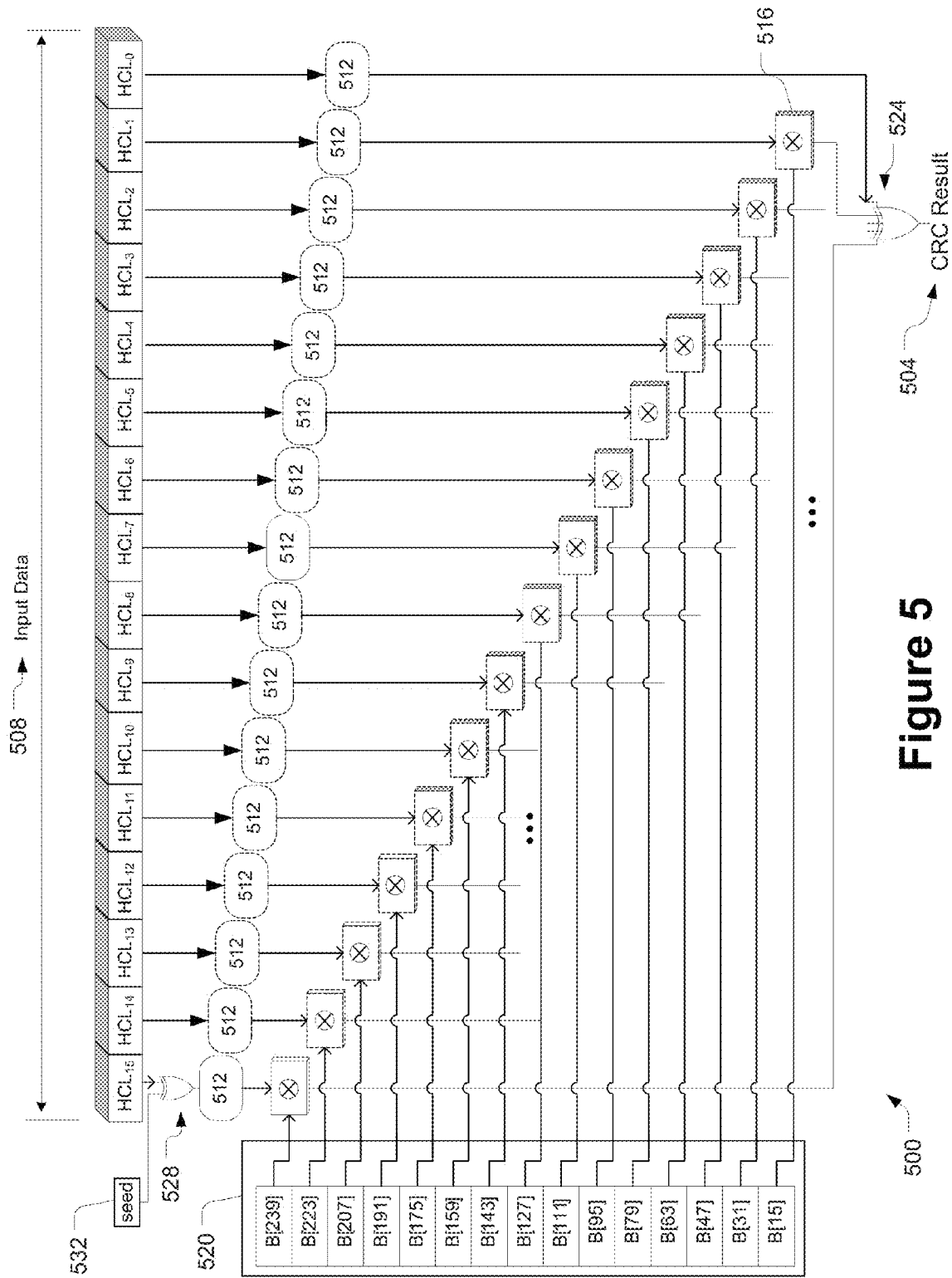
FIG. 5 schematically illustrates another cyclic redundancy check block in accordance with some embodiments.

FIG. 5 illustrates a CRC block 500 utilizing Horner's rule in accordance with some embodiments. The CRC block 500 may be configured to calculate a sixteen-bit CRC result 504 for 512 bytes of input data 508 as will be described. The input data 508 may be arranged as a plurality of segments such as half cache lines (HCLs) 0-15.

The CRC block 500 may have one 32-byte CRC block 512 coupled with a multiplier circuit 516. The 32-byte CRC block 512 and multiplier circuit 516 are shown multiple times to represent sequential operations that are to be described.

The multiplier circuit 516 may be coupled with a lookup table 520 storing a number of beta constants that may be used to time shift the partial CRC calculations to allow for the 32-byte CRC block 512 and the multiplier circuit 516 to be used to calculate the partial CRC result for the input data 508 as the input data 508 is streamed in.

The 32-byte CRC block 512 may be similar to, and substantially interchangeable with, either CRC block 200 or 400. The multiplier circuit 516 may be similar to, and substantially interchangeable with, either multiplier circuit 100 or 300.

W Mod G(x) for the input data 508 may be rearranged so that the 32-byte CRC block 512 uses the same beta constants B[15:0] for each half cache line (HCL) as the input data 508 is received. The mathematical expression for the CRC result 504 using Horner's rule, as rearranged, may be as follows.

$$(W255*B15+\ldots+W240*B0)*B239+$$
$$(W239*B15+\ldots+W224*B0)*B223+$$
$$(W223*B15+\ldots+W208*B0)*B207+$$
$$(W207*B15+\ldots+W192*B0)*B191+$$
$$(W191*B15+\ldots+W176*B0)*B175+$$
$$(W175*B15+\ldots+W160*B0)*B159+$$
$$(W159*B15+\ldots+W128*B0)*B127+$$
$$(W127*B15+\ldots+W112*B0)*B111+$$
$$(W111*B15+\ldots+W96*B0)*B95+$$
$$(W95*B15+\ldots+W80*B0)*B79+$$
$$(W79*B15+\ldots+W64*B0)*B63+$$
$$(W63*B15+\ldots+W48*B0)*B47+$$
$$(W47*B15+\ldots+W32*B0)*B31+$$
$$(W31*B15+\ldots+W16*B0)*B15+$$
$$(W15*B15+\ldots+W0*B0) \quad \text{Equation 5}$$

Thus, a lookup table within the 32-byte CRC block 512 may have beta constants B[15:0], which are to be used by the 32-byte CRC block 512 with each HCL. The beta constants that are pulled out of the parentheticals of Equation 5, i.e., B239, B223, B207, B191, B175, B159, B127, B111, B95, B79, B63, B47, B31, and B15, may be stored in lookup table 520 and accessible by the multiplier circuit 516. The lookup table within the 32-byte CRC block 512, which stores the first set of beta constants, may be the same as, or different from, the lookup table 520, which stores the second set of beta constants.

At time 0, the 32-byte CRC block 512 may receive $HCL_0$ and, using B[15:0] as described above with respect to CRC block 200 or 400, calculate a partial CRC result. The partial CRC result, calculated by the 32-byte CRC block 512 at time 0, may be provided directly to a combiner 524. That is, the partial CRC result is provided to the combiner 524 without first being provided to the multiplier circuit 516. It may be that the partial CRC result (and/or any input to the combiner 524) is stored in a register, latch, etc. associated with the combiner 524 to establish proper timing for the operations of the combiner 524.

At time 1, the 32-byte CRC block 512 may receive $HCL_1$ and calculate a partial CRC result. The partial CRC result, calculated by the 32-byte CRC block 512 at time 1, may be provided to the multiplier circuit 516 and, at time 2, the multiplier circuit 516 may multiply the partial CRC result with B[15]. The result may then be provided to the combiner 524.

Also at time 2, the 32-byte CRC block 512 may receive $HCL_2$ and calculate a partial CRC result, which is provided to the multiplier circuit 516, at time 3, where it is multiplied with B[31] and thereafter provided to the combiner 524. This process may proceed in a similar manner until, at time 15, the 32-byte CRC block 512 receives a value from combiner 528.

The combiner 528 may be an XOR module configured to XOR a 16-bit seed 532 with the most significant segment of the input data 508, i.e., $HCL_{15}$, to generate a combiner output that is provided to the multiplier circuit 512. A seed may be used in an LFSR circuit to provide an initial displacement value (randomness) for the CRC result before the data sequence is applied. In general, seeds provide variable and unique CRC results for the same input sequence. In storage systems, seeds having values of 0's or all F's are typically used to calculate CRC for initialized or uninitialized disks. For a classical LFSR circuit, seed initialization involves writing an initial seed to an N-bit LFSR register before the start of the operation. However, when GF2 multiply reduction operations for CRC computation is employed, it is not straightforward as to where the seed needs to be included in the operation for the results to be deemed functionally correct. The below-derived algorithm provides for the addition of a generalized, arbitrary seed (e.g., a seed including heterogeneous values) to any GF2 CRC circuit.

If A is the input message, S is the seed, then we can construct a tuple (M,A) where M is a 16-bit, transformed seed such that M Mod G(x)=S. (M+A) Mod G(x)=M Mod G(x)+A Mod G(x)=$M*B_k + A_{k-1}*B_{k-1} + \ldots A1*B1 + A0*B0$. Then we have $(M*B0*B_{k-1} + A_{k-1}*B_{k-1} + \ldots + A1*B1 + A0*B0)$ Mod G(x). This is equivalent to $(S*B_{k-1} + A_{k-1}*B_{k-1} + \ldots + A1*B1 + A0*B0)$ Mod G(x), since $M*B0$ Mod G(x)=S Mod G(x). Hence, we have $(S \hat{} A_{k-1})*B_{k-1} + \ldots + A1*B1 + A0*B0)$ Mod G(x). This derivation implies that the seed 532 may be used directly by the combiner 528 XOR'ing it into the most significant word, e.g., $HCL_{15}$ of the input data 508 and then use the Beta scaling (GF2 multiply) for calculating the CRC result 504.

Figure 6:
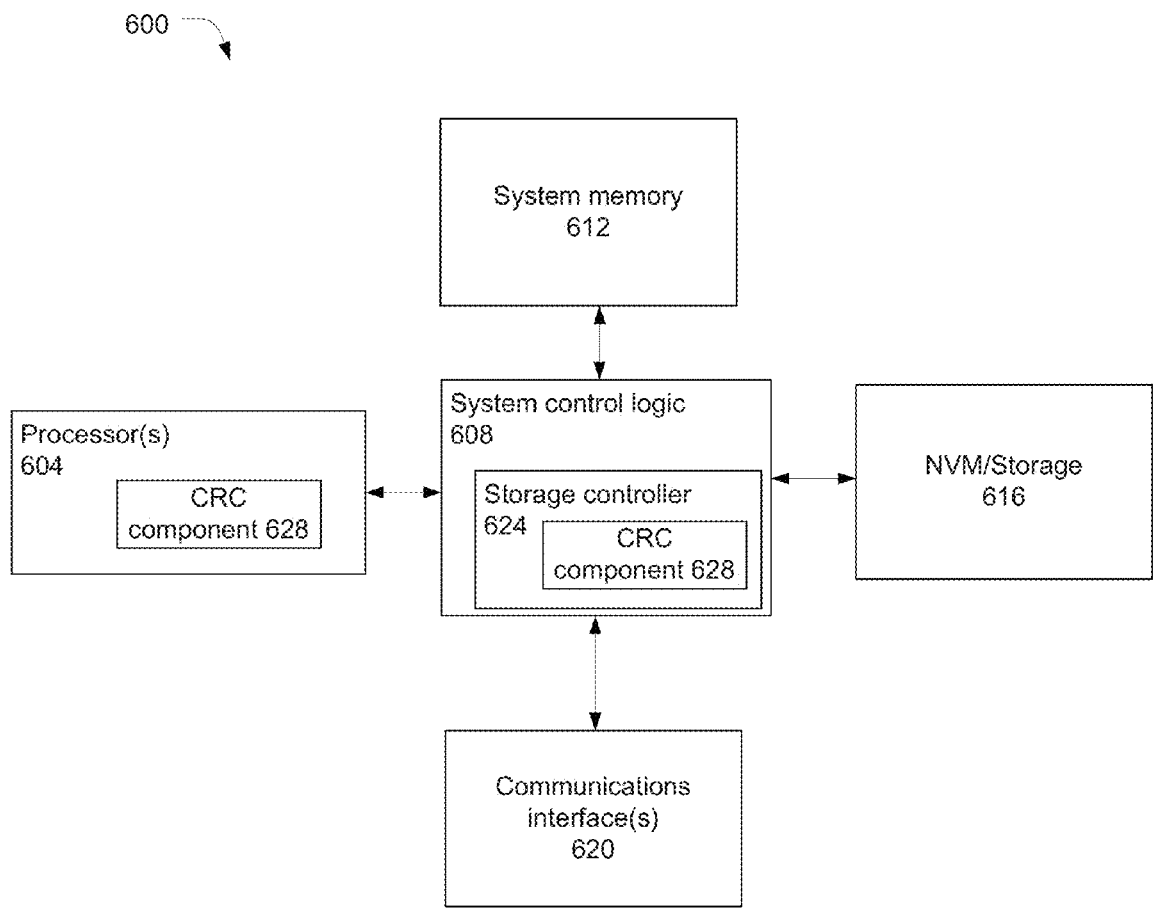
FIG. 6 illustrates an example system in accordance with some embodiments.

The CRC components described herein may be implemented into a system using any suitable hardware and/or software to configure as desired. FIG. 6 illustrates, for one embodiment, an example system 600 comprising one or more processor(s) 604, system control logic 608 coupled to at least one of the processor(s) 604, system memory 612 coupled to system control logic 608, non-volatile memory (NVM)/storage 616 coupled to system control logic 608, and one or more communications interface(s) 620 coupled to system control logic 608.

NVM/storage 616 may be used to store data and/or instructions, for example. NVM/storage 616 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disk (DVD) drive(s) for example. The NVM/storage 616 may include a storage resource physically part of a device on which the system 600 is installed or it may be accessible by, but not necessarily a part of, the device. For example, the NVM/storage 616 may be accessed over a network via the communications interface(s) 620.

Communications interface(s) 620 may provide an interface for system 600 to communicate over one or more network(s) and/or with any other suitable device. Communications interface(s) 620 may include any suitable hardware and/or firmware. Communications interface(s) 620 for one embodiment may include, for example, a network adapter, a wireless network adapter, a telephone modem, and/or a wireless modem. For wireless communications, communications interface(s) 620 for one embodiment may use one or more antennae.

For one embodiment, at least one of the processor(s) 604 may be packaged together with logic for one or more controller(s) of system control logic 608. For one embodiment, at least one of the processor(s) 604 may be packaged together with logic for one or more controllers of system control logic 608 to form a System in Package (SiP). For one embodiment, at least one of the processor(s) 604 may be integrated on the same die with logic for one or more controller(s) of system control logic 608. For one embodiment, at least one of the processor(s) 604 may be integrated on the same die with logic for one or more controller(s) of system control logic 608 to form a System on Chip (SoC).

System control logic 608 for one embodiment may include any suitable interface controllers to provide for any suitable interface to at least one of the processor(s) 604 and/or to any suitable device or component in communication with system control logic 608.

System control logic 608 for one embodiment may include a storage controller 624 to provide an interface to NVM/storage 616 to control movement of data/instructions into or out of NVM/storage 616.

The system 600 may include a CRC component 628 that is configured to control generating, checking, storing, and/or accessing CRC results. The CRC component 628 may include a CRC block such as CRC block 200, 300, or 500 in various embodiments. The CRC component 628 may be disposed within a processor of the processor(s) 604 and/or within the storage controller 624.

System control logic 608 for one embodiment may include one or more memory controller(s) to provide an interface to system memory 612. System memory 612 may be used to load and store data and/or instructions, for example, for system 600. System memory 612 for one embodiment may include any suitable volatile memory, such as suitable dynamic random access memory (DRAM), for example.

In various embodiments, system 600 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A circuit comprising:
    a cyclic redundancy check (CRC) block, having a first lookup table with a first set of constants, the CRC block configured to sequentially receive a plurality of segments of input data and to sequentially generate respective first partial CRC results based on the plurality of segments and the first set of constants;
    a second lookup table having a second set of constants;
    a multiplier circuit coupled with the CRC block and the second lookup table and configured to sequentially receive at least a subset of the first partial CRC results generated by the CRC block and to sequentially generate second partial CRC results based on individual first partial CRC results and individual constants of the second set of constants; and
    a combiner coupled with the CRC block and the multiplier circuit and configured to generate a CRC result that corresponds to the input data based on the second partial CRC results.

2. The circuit of claim 1, wherein the combiner is further configured to receive a first partial CRC result directly from the CRC block and to generate the CRC result based on the first partial CRC value.

3. The circuit of claim 2, wherein the first partial CRC results corresponds to a least significant segment of the plurality of segments.

4. The circuit of claim 1, wherein the combiner is a first combiner and the circuit further comprises:
    a second combiner coupled with the CRC block and configured to generate a second partial CRC result based on a most significant segment of the plurality of segments and a seed and provide the second partial CRC result to the CRC block.

5. The circuit of claim 1, wherein the combiner is a first combiner and the circuit further comprises:

a second combiner configured to receive and combine a seed and a most-significant segment of the plurality of segments to generate a combiner output;

wherein the CRC block is coupled with the second combiner and is configured to generate a first partial CRC result based on the combiner output.

6. The circuit of claim 5, wherein the seed includes heterogeneous values.

7. The circuit of claim 5, wherein the second combiner is configured to XOR the seed and the most-significant segment of the plurality of segments to generate the combiner output.

8. A method comprising:

generating, by a cyclic redundancy check (CRC) block, first partial CRC results based at least in part on a first set of constants in a first lookup table and segments of input data;

sequentially generating, by a multiplier circuit, second partial CRC results based at least in part on at least a sequential subset of the first partial CRC results and a second set of constants in a second lookup table; and generating, by a combiner, a CRC result corresponding to the input data based at least in part on the second partial CRC results.

9. The method of claim 8, further comprising:

receiving, by the combiner, a first partial CRC result directly from the CRC block; and generating the CRC result based at least in part on the first partial CRC value.

10. The method of claim 9, wherein the first partial CRC results corresponds to a least significant segment of the plurality of segments.

11. The method of claim 8, wherein the combiner is a first combiner and the method further comprises:

generating, by a second combiner, a second partial CRC result based at least in part on a most significant segment of the plurality of segments and a seed; and providing the second partial CRC result to the CRC block.

12. The method of claim 8, wherein the combiner is a first combiner and the method further comprises:

generating, by a second combiner, a combiner output based at least in part on a seed and a most-significant segment of the plurality of segments; and generating the first partial CRC result based at least in part on the combiner output.

13. The method of claim 12, wherein the seed includes heterogeneous values.

14. The method of claim 12, wherein the generating the combiner output includes XORing the seed and the most-significant segment of the plurality of segments.

15. One or more non-transitory computer readable media comprising instructions configured, upon execution of the instructions by a computing device, to cause the computing device to:

generate first partial CRC results based at least in part on a first set of constants in a first lookup table and segments of input data;

sequentially generate second partial CRC results based at least in part on at least a sequential subset of the first partial CRC results and a second set of constants in a second lookup table; and generate a CRC result corresponding to the input data based at least in part on the second partial CRC results.

16. The one or more computer readable media of claim 15, wherein the instructions are further configured to cause the computing device to:

receive a first partial CRC result directly from the CRC block; and generate the CRC result based at least in part on the first partial CRC value.

17. The one or more computer readable media of claim 16, wherein the first partial CRC results corresponds to a least significant segment of the plurality of segments.

18. The one or more computer readable media of claim 15, wherein the instructions are further configured to cause the computing device to generate a second partial CRC result based at least in part on a most significant segment of the plurality of segments and a seed.

19. The one or more computer readable media of claim 15, wherein the instructions are further configured to cause the computing device to:

generate a combiner output based at least in part on a seed and a most-significant segment of the plurality of segments; and generate the first partial CRC result based at least in part on the combiner output.

20. The one or more computer readable media of claim 19, wherein the seed includes heterogeneous values.

21. The one or more computer readable media of claim 19, wherein the instructions to generate the combiner output include instructions to perform an XOR of the seed and the most-significant segment of the plurality of segments.

* * * * *